(12) United States Patent
Chien (10) Patent No.: US 7,088,982 B1
(45) Date of Patent: Aug. 8, 2006

(54) GILBERT CELL AND METHOD THEREOF

(75) Inventor: George Chien, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 526 days.

(21) Appl. No.: 10/294,792

(22) Filed: Nov. 14, 2002

(51) Int. Cl.
*H04B 1/26* (2006.01)

(52) U.S. Cl. .............. 455/326; 455/333; 455/292; 455/338; 327/357; 327/359

(58) Field of Classification Search ............ 455/333, 455/326, 292, 338; 327/357, 359
See application file for complete search history.

(56) References Cited

U.S. PATENT DOCUMENTS

| | | | |
|---|---|---|---|
| 5,379,457 A | | 1/1995 | Nguyen |
| 5,448,772 A | * | 9/1995 | Grandfield ................ 455/333 |
| 5,563,545 A | * | 10/1996 | Scheinberg ............... 327/389 |
| 5,564,094 A | | 10/1996 | Anderson et al. |
| 5,872,486 A | | 2/1999 | Wagner et al. |
| 6,121,819 A | * | 9/2000 | Traylor ..................... 327/359 |
| 6,204,728 B1 | | 3/2001 | Hageraats |
| 6,229,395 B1 | | 5/2001 | Kay |
| 6,255,889 B1 | * | 7/2001 | Branson .................... 327/359 |
| 6,329,865 B1 | | 12/2001 | Hageraats et al. |
| 6,348,830 B1 | | 2/2002 | Rebeiz et al. |
| 2001/0028695 A1 | * | 10/2001 | Matsui ...................... 375/376 |
| 2002/0013137 A1 | * | 1/2002 | Asam ........................ 455/318 |
| 2005/0063270 A1 | * | 3/2005 | Yamaguchi et al. ....... 369/53.2 |

OTHER PUBLICATIONS

IEEE Standard 802.11b (Sep. 16, 1999; 96 pages); Supplement to IEE Standard for Information Technology; TelecommunicatioOns and Information Exchange Between Systems; Local and Metropolitan Area Networks; Specific Requirements; Part 11: Wireless LAN Medium Access Control (MAC) and Physical Layer (PHY) specifications; Higher-Speed Physical Layer Extension in the 2.4 GHz Band.

* cited by examiner

*Primary Examiner*—Doris H. To
*Assistant Examiner*—Minh Dao (57) ABSTRACT

A stacked Gilbert cell mixer performs two frequency conversions in at least one of a wireless transmitter and receiver and includes a first stage of the stacked Gilbert cell mixer that converts a voltage signal input to the stacked Gilbert cell mixer to a current signal. A second stage of the stacked Gilbert cell mixer communicates with said first stage of the stacked Gilbert cell mixer and performs a first frequency conversion. A third stage of the stacked Gilbert cell mixer communicates with the second stage of the stacked Gilbert cell mixer and performs a second frequency conversion. Said first stage includes first and second transistors, said second stage includes third, fourth, fifth and sixth transistors and said third stage includes seventh, eighth, ninth and tenth transistors.

53 Claims, 10 Drawing Sheets

FIG. 5A
_Prior Art_

GILBERT CELL AND METHOD THEREOF

FIELD OF THE INVENTION

The present invention relates to Gilbert cell mixers, and more particularly to Gilbert cell mixers for wireless transceivers.

BACKGROUND OF THE INVENTION

The demand for mobile communications equipment has increased dramatically in recent years. These devices demand low power dissipation, low cost, small area chip area and high performance. Therefore, a high level of integration of transceiver and digital circuits is required. For example, power consumption is a key performance parameter for battery powered wireless devices such as personal digital assistants (PDAs), computer laptops and other devices. When using submicron CMOS technologies, there are inherent limitations relating to supply voltages and currents that may be required. These supply voltage and current limitations adversely impact power consumption and make it difficult to meet low power design objectives.

Figure 1:
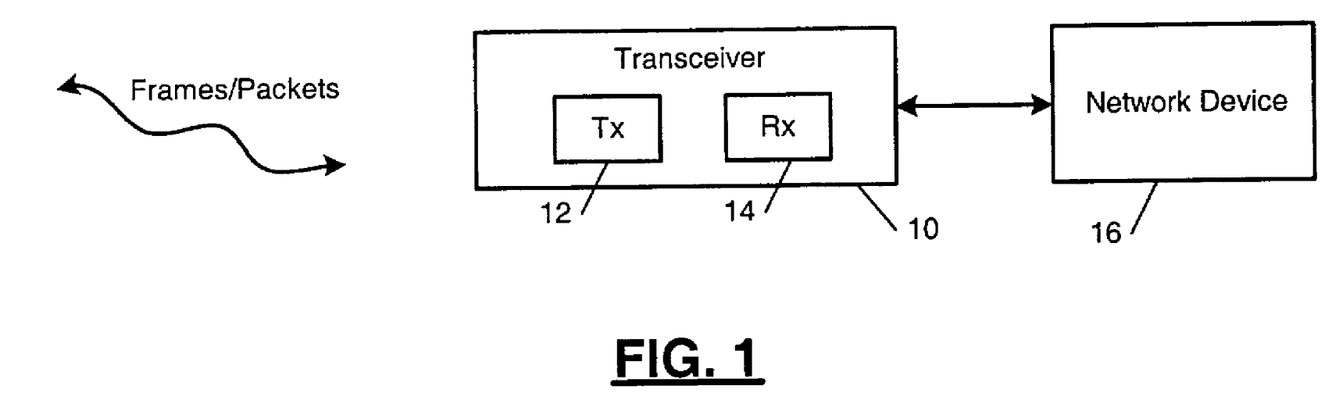
FIG. 1 is a functional block diagram of a wireless transceiver.

Referring now to FIG. 1, a wireless transceiver 10 is shown and includes a transmitter 12 and a receiver 14. The wireless transceiver 10 can be implemented using CMOS transistors or other transistor technologies. The wireless transceiver 10 may be integrated with a network interface card (NIC), a LAN on motherboard (LOM) for wireless data networks, with audio devices for voice communications, or with other devices.

Figure 2A:
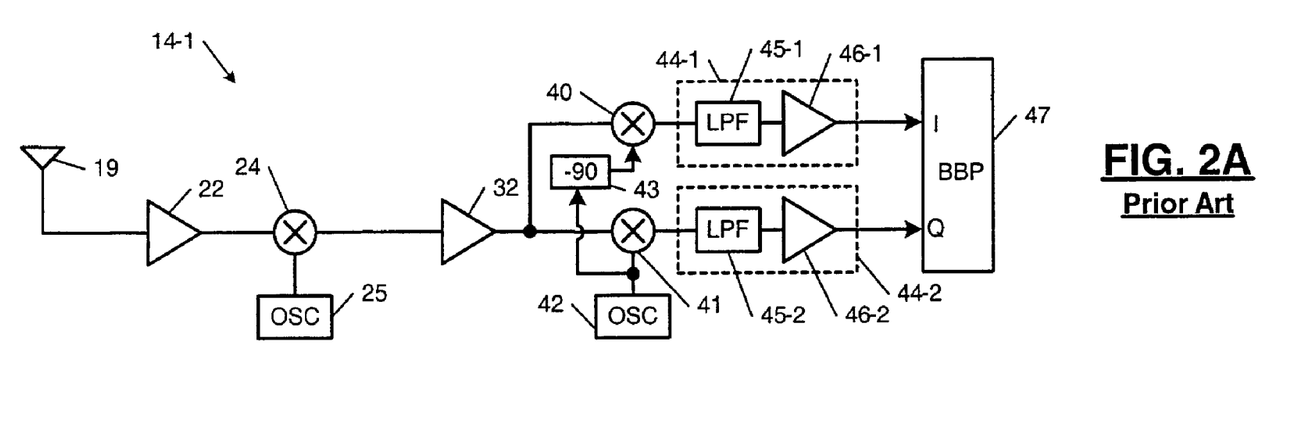
FIG. 2A is a functional block diagram of an exemplary super-heterodyne receiver architecture according to the prior art.

There are multiple different ways of implementing the transmitter 12 and the receiver 14. For purposes of illustration, simplified block diagrams of double-conversion and direct conversion transmitter and receiver architectures will be discussed, although other architectures may be used. Referring now to FIG. 2A, an exemplary double-conversion receiver 14-1 is shown. The receiver 14-1 includes an antenna 19 that is coupled to a low noise amplifier 22. An output of the amplifier 22 is coupled to a first input of a mixer 24. A second input of the mixer 24 is connected to an oscillator 25, which provides a reference frequency. The mixer 24 converts radio frequency (RF) signals to intermediate frequency (IF) signals.

An output of the mixer 24 is connected to an automatic gain control amplifier (AGCA) 32. An output of the AGCA 32 is coupled to first inputs of mixers 40 and 41. A second input of the mixer 41 is coupled to an oscillator 42, which provides a reference frequency. A second input of the mixer 40 is connected to the oscillator 42 through a −90° phase shifter 43. The mixers 40 and 41 convert the IF signals to baseband (BB) signals. Outputs of the mixers 40 and 41 are coupled to BB circuits 44-1 and 44-2, respectively. The BB circuits 44-1 and 44-2 may include low pass filters (LPF) 45-1 and 45-2 and gain blocks 46-1 and 46-2, respectively, although other BB circuits may be used. Mixer 40 generates an in-phase (I) signal, which is output to a BB processor 47. The mixer 41 generates a quadrature-phase (Q) signal, which is output to the BB processor 47.

Figure 2B:
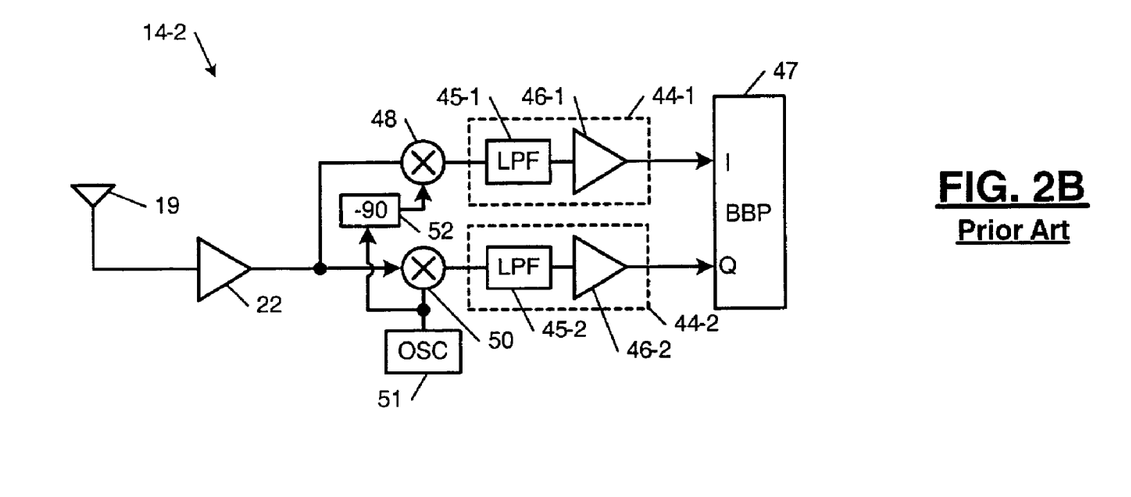
FIG. 2B is a functional block diagram of an exemplary direct receiver architecture according to the prior art.

Referring now to FIG. 2B, an exemplary direct receiver 14-2 is shown. The receiver 14-2 includes the antenna 19 that is coupled to the low noise amplifier 22. An output of the low noise amplifier 22 is coupled to first inputs of RF to BB mixers 48 and 50. A second input of the mixer 50 is connected to oscillator 51, which provides a reference frequency. A second input of the mixer 48 is connected to the oscillator 51 through a −90° phase shifter 52. The mixer 48 outputs the I-signal to the BB circuit 44-1, which may include the LPF 45-1 and the gain block 46-1. An output of the BB circuit 44-1 is input to the BB processor 47. Similarly, the mixer 50 outputs the Q signal to the BB circuit 44-2, which may include the LPF 45-2 and the gain block 46-2. An output of the BB circuit 44-2 is output to the BB processor 47.

Figure 3A:
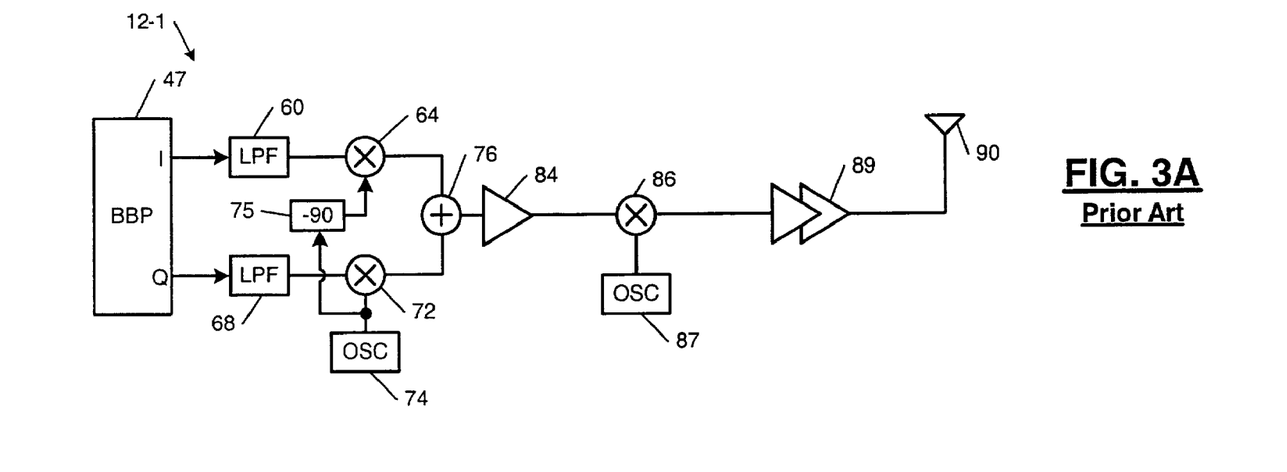
FIG. 3A is a functional block diagram of an exemplary super-heterodyne transmitter architecture according to the prior art.

Referring now to FIG. 3A, an exemplary double-conversion transmitter 12-1 is shown. The transmitter 12-1 receives an I signal from the BB processor 47. The I signal is input to a LPF 60 that is coupled to a first input of a BB to IF mixer 64. A Q signal of the BB processor 47 is input to a LPF 68 that is coupled to a first input of a BB to IF mixer 72. The mixer 72 has a second input that is coupled to an oscillator 74, which provides a reference frequency. The mixer 64 has a second input that is coupled to the oscillator through a −90° phase shifter 75.

Outputs of the mixers 64 and 72 are input to a summer 76. The summer 76 combines the signals into a complex signal that is input to a variable gain amplifier (VGA) 84. The VGA 84 is connected to a first input of an IF to RF mixer 86. A second input of the mixer 86 is connected to an oscillator 87, which provides a reference frequency. An output of the mixer 86 is coupled to a power amplifier 89, which may include a driver. The power amplifier 89 drives an antenna 90.

Figure 3B:
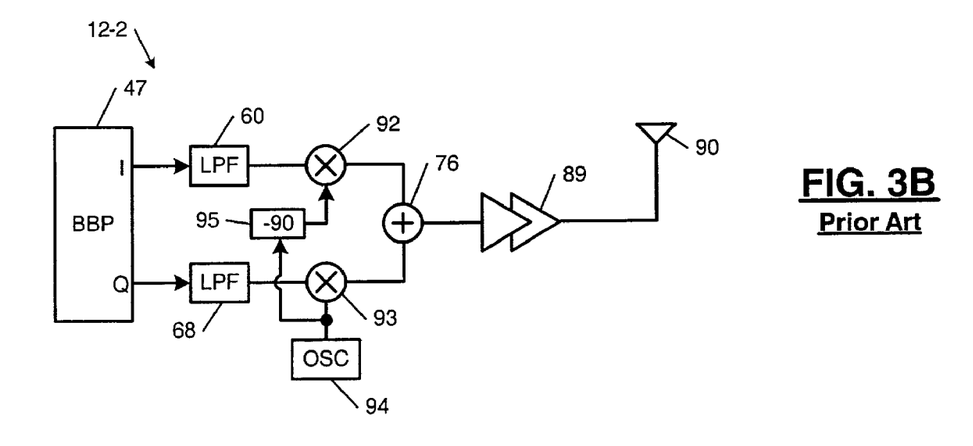
FIG. 3B is a functional block diagram of an exemplary direct transmitter architecture according to the prior art.

Referring now to FIG. 3B, an exemplary direct transmitter 12-2 is shown. The transmitter 12-2 receives an I signal from the BB processor 47. The I signal is input to the LPF 60, which has an output that is coupled to a first input of a BB to RF mixer 92. A Q signal of the BB processor 47 is input to the LPF 68, which is coupled to a first input of a BB to RF mixer 93. The mixer 93 has a second input that is coupled to an oscillator 94, which provides a reference frequency. The mixer 92 has a second input that is connected to the oscillator 94 through a −90° phase shifter 95. Outputs of the mixers 92 and 93 are input to the summer 76. The summer 76 combines the signals into a complex signal that is input the power amplifier 89. The power amplifier 89 drives the antenna 90.

As can be appreciated, transceivers can have double or single conversion. The advantages and disadvantages relating to each transceiver architecture are generally known in the art. In the case of double conversion, the transceiver 10 performs two frequency conversion steps during transmission and reception. In the transmitter 12, the BB input signal is converted to an IF signal. The IF signal is converted to a RF signal for transmission. In the receiver 14, the RF input signal is converted to an IF signal. The IF signal is converted to a BB signal for further processing.

In the case of direct conversion, the transceiver performs a single conversion step during transmission and reception. In the transmitter, the BB input signal is converted to an RF signal directly. In the receiver, the RF signal is converted to a BB signal in one frequency conversion step.

Figure 4:
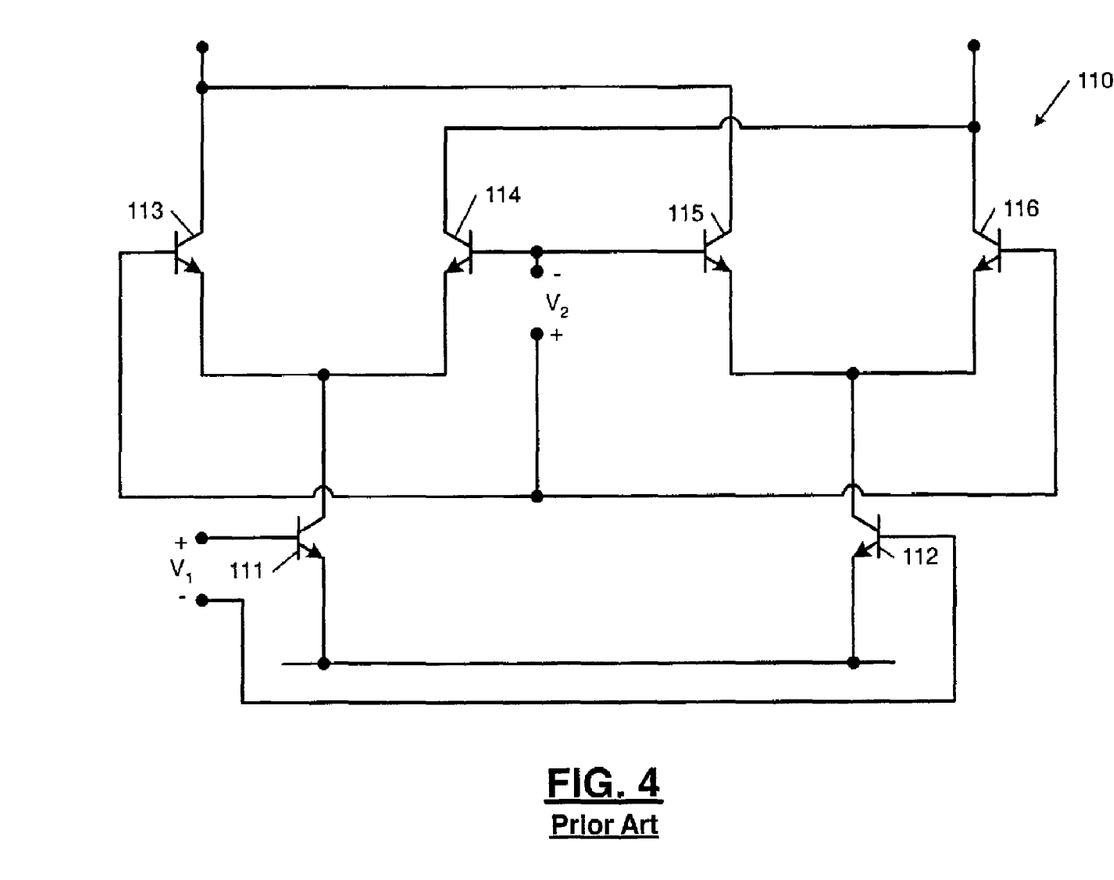
FIG. 4 is an electrical schematic of a Gilbert cell mixer implemented using bipolar junction transistors (BJTs) according to the prior art.

The mixers in the wireless transceiver 10 can be implemented using Gilbert cell mixers. Referring now to FIG. 4, a Gilbert cell multiplexer/mixer 110 is implemented using bipolar junction transistors (BJTs). The Gilbert cell multiplexer/mixer 110 includes a first transistor 111 and a second transistor 112, which have an emitter connected to a reference potential such as ground or virtual ground. A base of the first transistor 111 is connected to a first lead of a first voltage source. A base of the second transistor 112 is connected to a second lead of the first voltage source.

The Gilbert cell multiplexer/mixer 110 further includes third, fourth, fifth, and sixth transistors 113, 114, 115, and 116. A collector of the first transistor 111 is coupled to emitters of the third and fourth transistors 113 and 114. A collector of the second transistor 112 is coupled to emitters of the fifth and sixth transistors 115 and 116.

A base of the fourth transistor 114 is connected to a base of the fifth transistor 115. The bases of the fourth and fifth transistors 114 and 115 are connected to a negative lead of a second voltage source. A positive lead of the second voltage source is connected to bases of the third and sixth transistors 113 and 116. A collector of the third transistor 113 is connected to a collector of the fifth transistor 115. A collector of the fourth transistor 114 is connected to a collector of the sixth transistor 116.

Figures 5A, 5B:
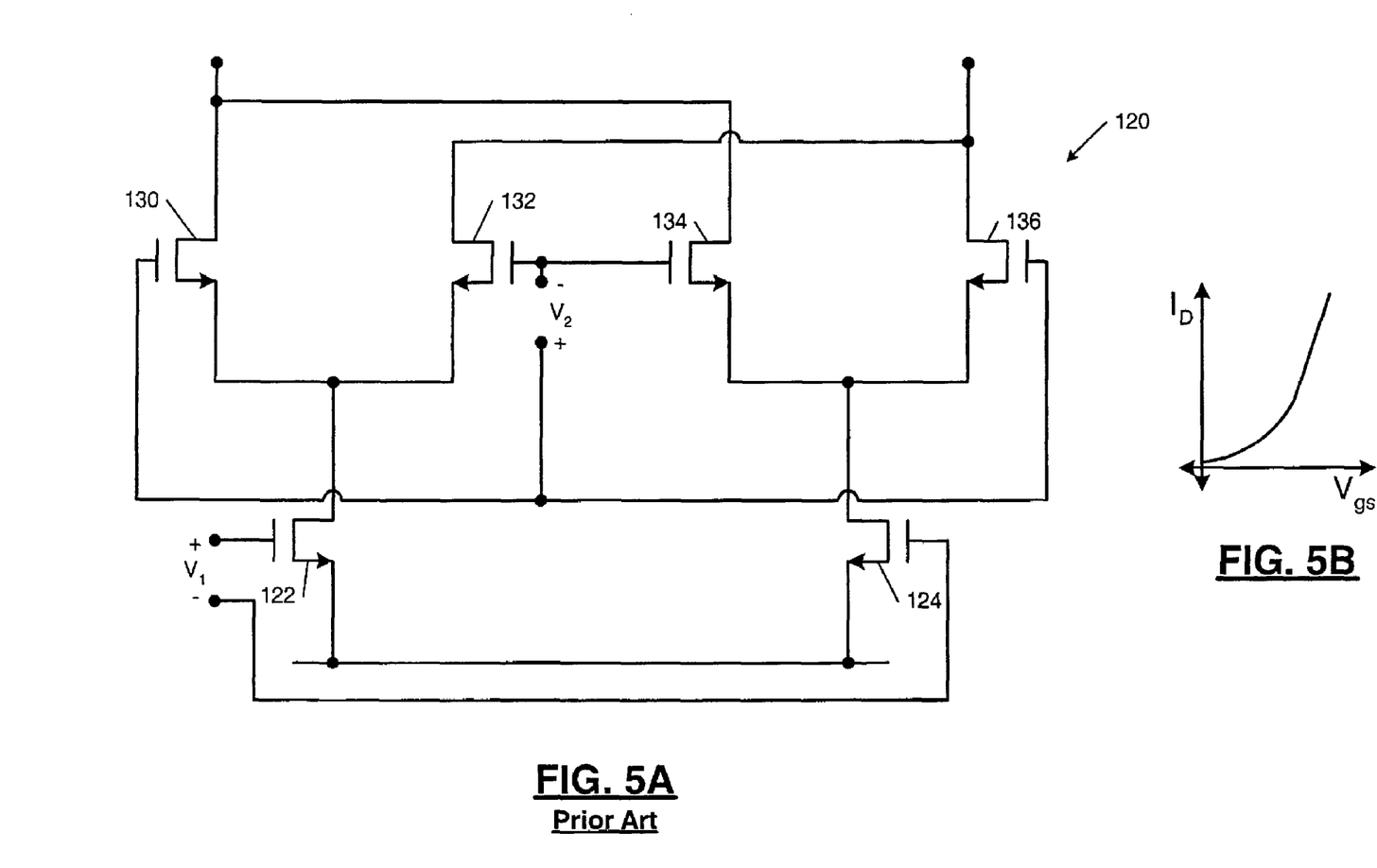
FIG. 5A is an electrical schematic of a Gilbert cell mixer implemented using CMOS transistors according to the prior art.
FIG. 5B illustrates $I_D$ as a function of $V_{GS}$ for a CMOS transistor.

Referring now to FIG. 5A, a Gilbert Cell mixer 120 that is implemented using CMOS transistors according to the prior art is shown. The Gilbert cell mixer 120 includes a first transistor 122 and a second transistor 124, which have a source connected to a reference potential such as ground or virtual ground. A gate of the first transistor 122 is connected to one lead of a first voltage source. A gate of the second transistor 124 is connected to another lead of the first voltage source. The transistors 122 and 124 are used as a transconductor, which transforms a voltage signal to a current signal.

The CMOS Gilbert cell mixer 120 further includes third, fourth, fifth, and sixth transistors 130, 132, 134, and 136. A drain of the first transistor 122 is coupled to sources of the third and fourth transistors 130 and 132. A drain of the second transistor 124 is coupled to sources of the fifth and sixth transistors 134 and 136.

A gate of the fourth transistor 132 is connected to a gate of the fifth transistor 134. The gates of the fourth and fifth transistors 132 and 134 are connected to a first lead of a second voltage source. Another lead of the second voltage source is connected to gates of the third and sixth transistors 130 and 136. A drain of the third transistor 130 is connected to a drain of the fifth transistor 134. A drain of the fourth transistor 132 is connected to a drain of the sixth transistor 136. Typically, the first voltage source is a radio frequency, intermediate frequency, or baseband signal requiring frequency conversion (up or down) and the second voltage source is a local oscillator or a reference frequency.

Ideally, the second voltage source outputs a square wave for ideal switching of the transistors 130, 132, 134 and 136. However, the second voltage source typically outputs a sine wave. Conversion loss occurs, which is related to a difference between the ideal square wave and the actual sine wave. For portable applications, power consumption is extremely important. When using double conversion, extra current is consumed for the $2^{nd}$ mixer compared with direct conversion. Furthermore, typical design constraints for designing mixers for transceivers include high third-order intermodulation intercept point (IP3) linearity and high conversion gain.

For CMOS transistors, high linearity can be achieved by increasing $I_D$ for a given transistor or effectively increasing the overdrive voltage. CMOS devices become more linear as with larger over drive voltage. As $I_D$ increases, however, a higher voltage drive must be used to turn on/off the transistors 130–136, which increases the power consumption of the circuit driving these transistors (or if the same driving voltage is applied, the switching becomes less ideal and adversely affects the conversion gain).

SUMMARY OF THE INVENTION

A stacked Gilbert cell mixer according to the present invention performs two frequency conversions in a wireless transceiver. A first stage of the stacked Gilbert cell mixer converts a voltage signal to a current signal. A second stage of the stacked Gilbert cell mixer communicates with the first stage of the stacked Gilbert cell mixer and performs a first frequency conversion. A third stage of the stacked Gilbert cell mixer communicates with the second stage of the stacked Gilbert cell mixer and performs a second frequency conversion.

In other features, the first stage includes first and second transistors. The second stage includes third, fourth, fifth and sixth transistors. The third stage includes seventh, eighth, ninth and tenth transistors. A first voltage source has a first output that communicates with a base of the first transistor and a second output that communicates with a base of the second transistor. A second voltage source has a first output that communicates with bases of the fourth and fifth transistors and a second output that communicates with bases of the third and sixth transistors. A third voltage source has a first output that communicates with bases of the eighth and ninth transistors and a second output that communicates with bases of the seventh and tenth transistors.

In still other features, a collector of the first transistor communicates with emitters of the third and fourth transistors and a collector of the second transistor communicates with emitters of the fifth and sixth transistors. A base of the fourth transistor communicates with a base of the fifth transistor and a base of the third transistor communicates with a base of the sixth transistor.

In yet other features, a collector of the third transistor communicates with a collector of the fifth transistor. A collector of the fourth transistor communicates with a collector of the sixth transistor. An emitter of the seventh transistor communicates with an emitter of the eighth transistor. An emitter of the ninth transistor communicates with an emitter of the tenth transistor. A collector of the seventh transistor communicates with a collector of the ninth transistor. A collector of the eighth transistor communicates with a collector of the tenth transistor. Collectors of the third and fifth transistors communicate with emitters of the seventh and eighth transistors. Collectors of the fourth and sixth transistors communicate with emitters of the ninth and tenth transistors.

A Gilbert cell mixer according to the present invention for a wireless transceiver includes first, second, third, fourth, fifth, and sixth CMOS transistors that are configured to form said Gilbert cell mixer. A first current source communicates with sources of the third and fourth CMOS transistors. A second current source communicates with sources of the fifth and sixth CMOS transistors. A first inductor substantially offsets parasitic capacitance and noise generated by the first and second current sources.

In other features, the first inductor has one end that communicates with the source of the fourth CMOS transistor and an opposite end that communicates with the source of the fifth CMOS transistor. Alternately, the first inductor has one end that communicates with the source of the fourth CMOS transistor. A second inductor communicates with the source of the fifth CMOS transistor.

In still other features, a first voltage source has a first output that communicates with a gate of the first CMOS transistor. A second output communicates with a gate of the second CMOS transistor. A second voltage source has a first output that communicates with gates of the fourth and fifth CMOS transistors. A second output communicates with gates of the third and sixth CMOS transistors.

In other features, a drain of the first CMOS transistor communicates with the sources of the third and fourth CMOS transistors. A drain of the second CMOS transistor communicates with the sources of the fifth and sixth CMOS transistors. A gate of the fourth CMOS transistor communicates with a gate of the fifth CMOS transistor.

In still other features, a drain of the third CMOS transistor communicates with a drain of the fifth CMOS transistor. A drain of the fourth CMOS transistor communicates with a drain of the sixth CMOS transistor.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify similar elements.

Figure 6A:
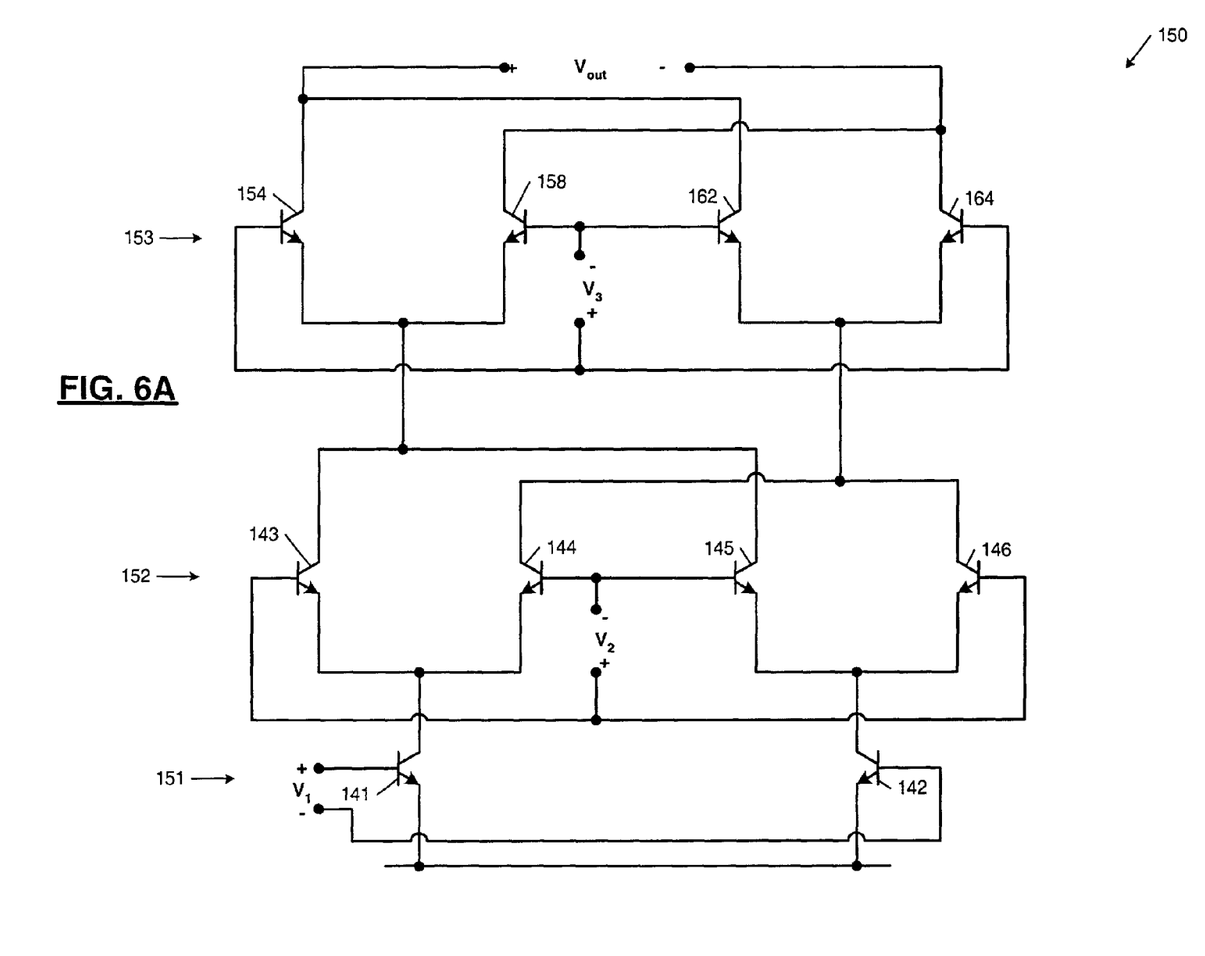
FIG. 6A illustrates a stacked Gilbert cell mixer according to the present invention.

Referring now to FIG. 6A, a stacked Gilbert cell mixer according to the present invention is shown generally at 150. In a preferred embodiment, the stacked Gilbert cell mixer 150 is implemented using bipolar junction transistors, although the other transistor types may be used. The stacked Gilbert cell mixer 150 includes a first stage 151 that converts voltage to current. Second and third stages 152 and 153 perform first and second frequency conversions, such as RF to IF and IF to BB or BB to IF and IF to RF. As can be appreciated, the frequency conversion is performed in a filter-less manner since there are no filters located between mixers of the second and third stages.

The stacked Gilbert cell mixer 150 includes a seventh transistor 154 that has an emitter that is connected to an emitter of an eighth transistor 158. The collectors of the third and fifth transistors 143 and 145 are connected to the emitters of the seventh and eighth transistors 154 and 158. A base of the eighth transistor 158 is connected to a base of a ninth transistor 162. An emitter of the ninth transistor 162 is connected to an emitter of a tenth transistor 164. The collectors of the fourth and sixth transistors 144 and 146 are connected to the emitters of the ninth and tenth transistors 162 and 164.

A collector of the seventh transistor 154 is connected to a collector of the ninth transistor 162. A collector of the eighth transistor 158 is connected to a collector of the tenth transistor 164. A third voltage source has a first lead that is connected to the bases of the eighth and ninth transistors 158 and 162. A second lead of the third voltage source is connected to bases of the seventh and tenth transistors 154 and 164. Current output of the stacked Gilbert cell mixer 150 is taken from the collectors of the seventh and ninth transistors 154 and 162 and the collectors of the eighth and tenth transistors 158 and 164.

The first voltage source is typically a baseband signal for transmitters or a RF signal for receivers. The second and third voltages are typically generated by local oscillators or other reference frequency generators. In an exemplary embodiment, the transistors 141–146, 154, 158, 162, and 164 are implemented using BJTs. For example, the BJTs can be fabricated using silicon-germanium. Skilled artisans will appreciate that the transistors may be implemented using other transistors and/or other materials.

Figure 6B:
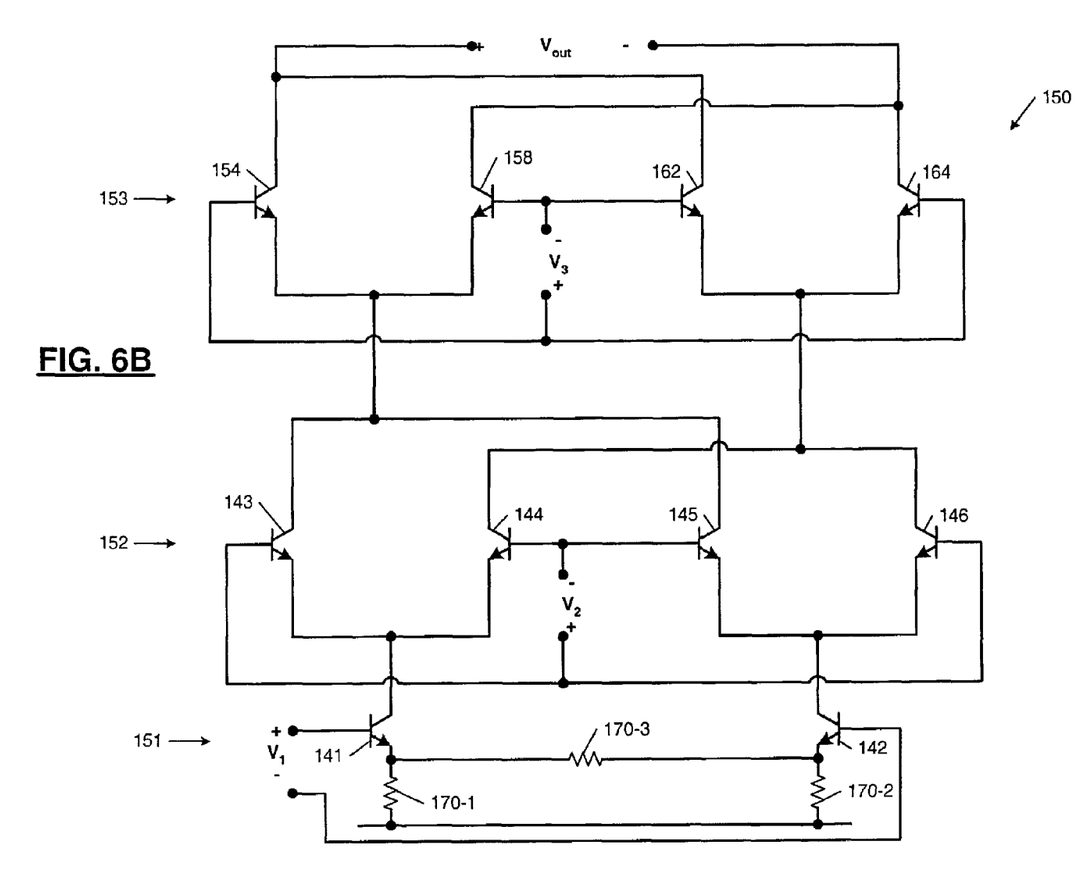
FIG. 6B illustrates the stacked Gilbert cell mixer of FIG. 6A with biasing resistors for controlling $g_m$.

In FIG. 6B, the stacked Gilbert cell mixer 150 includes one or more biasing resistors 170. The biasing resistors 170 may be used to adjust $g_m$. For example, first and second biasing resistors 170-1 and 170-2 are coupled to emitters of the transistors 141 and 142, respectively. A third biasing resistor 170-3 may be coupled between the emitters or the transistors 141 and 142.

By stacking the two Gilbert cells, the bias current used in the first Gilbert cell can be re-used in the second, which reduces the power consumption as compared with two separate Gilbert Cells used in double conversion transceiver architectures. The stacked Gilbert cell mixer 150 according to the present invention reduces the number of voltage to current conversions when two frequency conversions are required. The number of voltage to current conversions typically adversely impacts linearity performance of the mixer. When a double conversion transceiver architecture is required by the system, this approach can be used to reduce the power consumption to approximately that of a direct conversion.

The stacked Gilbert cell mixer 150 according to the present invention converts voltage to current once for two frequency conversions. The reduced number of voltage to current conversions improves the linearity performance of the stacked Gilbert cell mixer 150. If the stacked Gilbert cell mixer 150 is implemented using BJTs, the lower $V_{CE}$ (typically ~0.4 to 0.6V each, or 1.2 to 1.8V for a stack of three) of the stacked BJTs requires less voltage headroom as compared with stacked CMOS transistors, which require higher $V_{DS}$ (~0.8V or 2.4V for a stack of three).

Figure 7A:
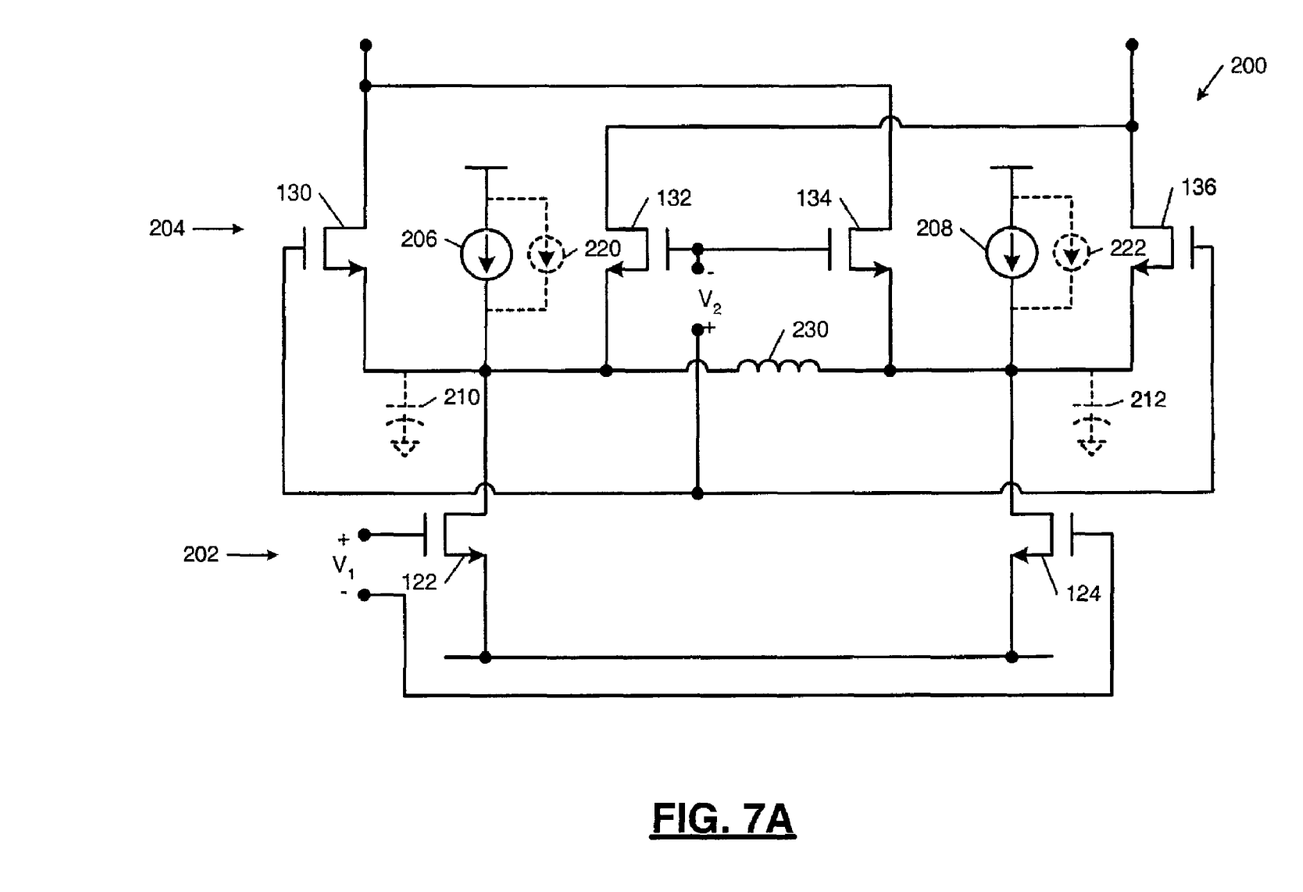
FIG. 7A is an electrical schematic of a first Gilbert cell mixer according to the present invention.

Referring now to FIG. 7A, a Gilbert cell mixer according to the present invention is shown. The Gilbert cell mixer 200 includes a first stage 202 that converts voltage to current and a second stage 204 that performs frequency conversion. The Gilbert cell mixer 200 includes a first current source 206 and a second current source 208. In order to achieve the required linearity, a large current is required for transistors 122 and 124. To provide the large current, the over drive voltage for transistors 130–136 is increased. This increases the required driving voltage for transistors 130–136. The first and second current sources 206 and 208 reduce current flow through the transistors 130–136. The first current source 206 is connected between the source of the third transistor 130 and the source of the fourth transistor 132. A second current source 208 is connected between the source of the fifth transistor 134 and the source of the sixth transistor 136.

To achieve the desired conversion gain, large transconductance devices are needed in addition to the large current. These devices introduce parasitic capacitance at the sources of the transistors 130–136. Furthermore, the first and second current sources 206 and 208 create parasitic capacitances 210 and 212 and noise (represented by current sources 220 and 222). To reduce the effects of the parasitic capacitances 210 and 212 and the current sources 220 and 222, an inductor 230 is connected in series between a source of the fourth transistor 132 and a source of the fifth transistor 134. The inductance value of the inductor 230 is preferably selected such that a parallel combination of the parasitic capacitances 210 and 212 and the inductor 230 approaches a very high or infinite impedance. In other words:

$$(1/sC) \| sL \to \infty.$$

Figure 7B:
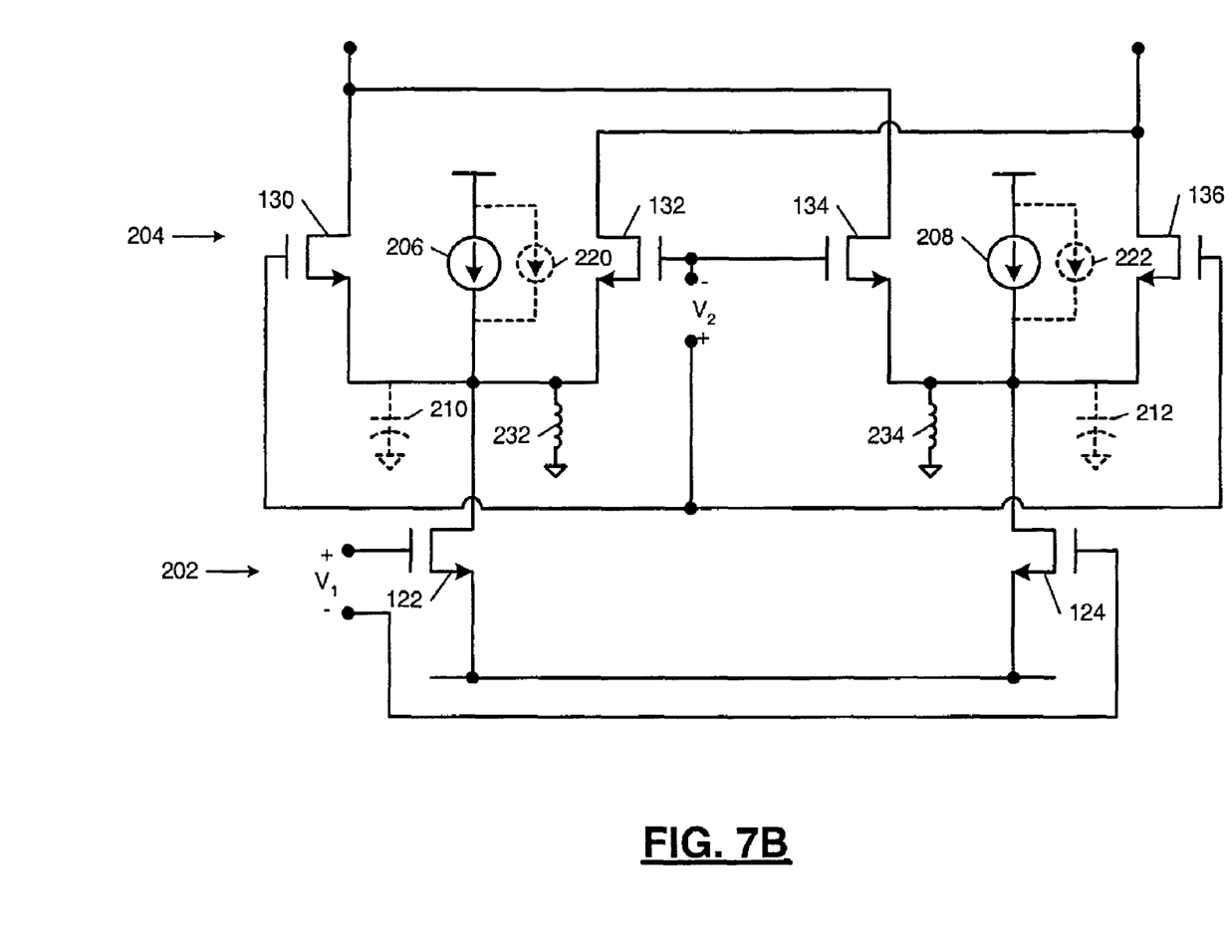
FIG. 7B is an electrical schematic of a second Gilbert cell mixer according to the present invention.
Figure 8:
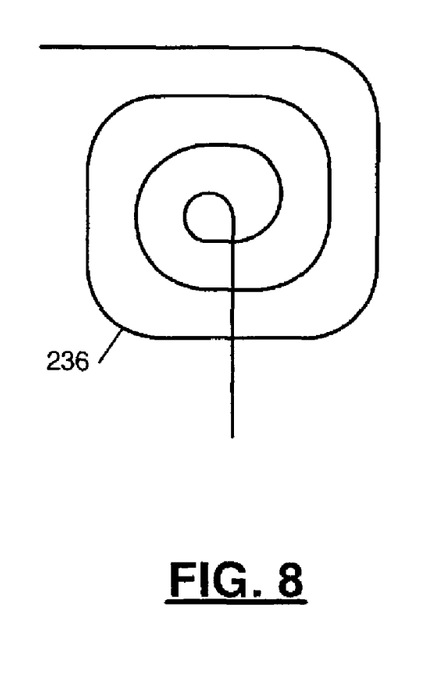
FIG. 8 illustrates a first exemplary on-chip inductor for the Gilbert cell mixers of FIGS. 7A and 7B.
Figure 9:
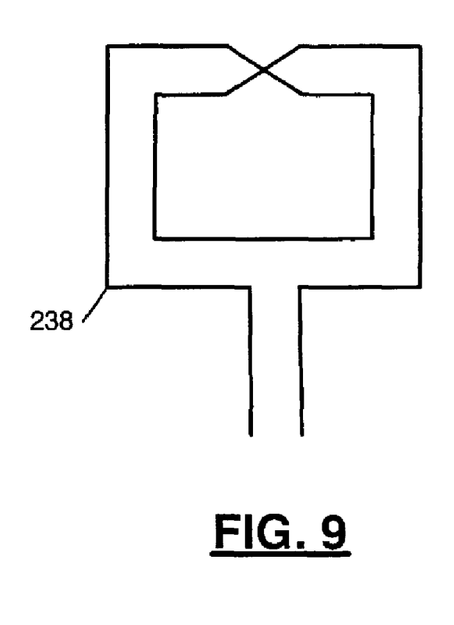
FIG. 9 illustrates a second exemplary on-chip inductor for the Gilbert cell mixer of FIGS. 7A and 7B.

In FIG. 7B, the inductor 230 can also be implemented in parallel as shown at 232 and 234. However, the single series inductor 230 can reduce chip area. Referring now to FIGS. 8 and 9, the inductors 230–234 are preferably implemented on-chip. In FIG. 8, a spiral inductor 236 is shown. In FIG. 9, a symmetric inductor 238 is shown. Skilled artisans will appreciate that other inductor implementations may be used without departing from the invention. As can be appreciated, the current sources reduce the current flow through the transistors 130–136 and the driving voltage requirement, which lowers the power consumption of the overall mixer and driver block. The reduced current flowing through transistors 130–136 decreases the voltage driving strength, lowers power consumption and reduces the size of the mixer 200. It also provides higher IP3 linearity and conversion gain than conventional mixer designs with the same specifications.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A stacked Gilbert cell mixer that performs two frequency conversions in at least one of a wireless transmitter and receiver, comprising:
   a first stage of the stacked Gilbert cell mixer that converts a voltage signal input to the stacked Gilbert cell mixer to a current signal;
   a second stage of the stacked Gilbert cell mixer that communicates with said first stage of the stacked Gilbert cell mixer and that Performs a first frequency conversion; and
   a third stage of the stacked Gilbert cell mixer that communicates with the second stage of the stacked Gilbert cell mixer and that performs a second frequency conversion,
   wherein said first stage includes first and second transistors, said second stage includes third, fourth, fifth and sixth transistors and said third stage includes seventh, eighth, ninth and tenth transistors.

2. The stacked Gilbert cell mixer of claim 1 wherein said mixer is implemented using bipolar junction transistors (BJTs).

3. The stacked Gilbert cell mixer of claim 2 wherein the stacked Gilbert cell mixer performs said first and second frequency conversions without filtering between said first and second frequency conversions.

4. The stacked Gilbert cell mixer of claim 1 further comprising:
   a first voltage source having a first output that communicates with a base of said first transistor and a second output that communicates with a base of said second transistor;
   a second voltage source having a first output that communicates with bases of said fourth and fifth transistors and a second output that communicates with bases of said third and sixth transistors; and
   a third voltage source having a first output that communicates with bases of said eighth and ninth transistors and a second output that communicates with bases of said seventh and tenth transistors.

5. The stacked Gilbert cell mixer of claim 1 wherein a collector of said first transistor communicates with emitters of said third and fourth transistors and a collector of said second transistor communicates with emitters of said fifth and sixth transistors, and wherein a base of said fourth transistor communicates with a base of said fifth transistor and a base of said third transistor communicates with a base of said sixth transistor.

6. The stacked Gilbert cell mixer of claim 1 wherein a collector of said third transistor communicates with a collector of said fifth transistor and a collector of said fourth transistor communicates with a collector of said sixth transistor.

7. The stacked Gilbert cell mixer of claim 1 wherein an emitter of said seventh transistor communicates with an emitter of said eighth transistor and an emitter of said ninth transistor communicates with an emitter of said tenth transistor, and wherein a collector of said seventh transistor communicates with a collector of said ninth transistor and a collector of said eighth transistor communicates with a collector of said tenth transistor.

8. The stacked Gilbert cell mixer of claim 1 wherein collectors of said third and fifth transistors communicate with emitters of said seventh and eighth transistors and wherein collectors of said fourth and sixth transistors communicate with emitters of said ninth and tenth transistors.

9. A Gilbert cell mixer for at least one of a wireless transmitter and receiver, comprising:
   first, second, third, fourth, fifth, and sixth CMOS transistors that are configured to form said Gilbert cell mixer;
   a first current source that communicates with sources of said third and fourth CMOS transistors;
   a second current source that communicates with sources of said fifth and sixth CMOS transistors; and a first inductance having one end that communicates with at least one of said source of said fourth transistor and said source of said fifth transistor that substantially offsets parasitic capacitance and noise generated by at least one of said first and second current sources.

10. The Gilbert cell mixer of claim 9 wherein said first inductance has one end that communicates with said source of said fourth CMOS transistor and an opposite end that communicates with said source of said fifth CMOS transistor.

11. The Gilbert cell mixer of claim 9 wherein said first inductance has one end that communicates with said source of said fourth CMOS transistor and further comprising a second inductance that communicates with said source of said fifth CMOS transistor.

12. The Gilbert cell mixer of claim 9 further comprising:
a first voltage source having a first output that communicates with a gate of said first CMOS transistor and a second output that communicates with a gate of said second CMOS transistor; and
a second voltage source having a first output that communicates with gates of said fourth and fifth CMOS transistors and a second output that communicates with gates of said third and sixth CMOS transistors.

13. The Gilbert cell mixer of claim 9 wherein a drain of said first CMOS transistor communicates with said sources of said third and fourth CMOS transistors and a drain of said second CMOS transistor communicates with said sources of said fifth and sixth CMOS transistors, and wherein a gate of said fourth CMOS transistor communicates with a gate of said fifth CMOS transistor.

14. The Gilbert cell mixer of claim 9 wherein a drain of said third CMOS transistor communicates with a drain of said fifth CMOS transistor and a drain of said fourth CMOS transistor communicates with a drain of said sixth CMOS transistor.

15. The Gilbert cell mixer of claim 9 wherein said first inductance is implemented on-chip using one of a spiral inductance and an asymmetric inductance.

16. A Gilbert cell mixer for at least one of a wireless transmitter and receiver, comprising:
a first stage that converts voltage to current;
a second stage that communicates with the first stage, that performs frequency conversion and that includes third, fourth, fifth, and sixth CMOS transistors;
a first current source that communicates with sources of said third and fourth CMOS transistors;
a second current source that communicates with sources of said fifth and sixth CMOS transistors; and
a first inductance that communicates with at least one of said source of said fourth transistor and said source of said fifth transistor and that substantially offsets parasitic capacitance and noise generated by at least one of said first and second current sources.

17. The Gilbert cell mixer of claim 16 wherein said first inductance has one end that communicates with said source of said fourth CMOS transistor and an opposite end that communicates with said source of said fifth CMOS transistor.

18. The Gilbert cell mixer of claim 16 wherein said first inductance has one end that communicates with said source of said fourth CMOS transistor and further comprising a second inductance that communicates with said source of said fifth CMOS transistor.

19. The Gilbert cell mixer of claim 16 wherein said first stage includes first and second CMOS transistors.

20. The Gilbert cell mixer of claim 19 further comprising:
a first voltage source having a first output that communicates with a gate of said first CMOS transistor and a second output that communicates with a gate of said second CMOS transistor; and
a second voltage source having a first output that communicates with gates of said fourth and fifth CMOS transistors and a second output that communicates with gates of said third and sixth CMOS transistors.

21. The Gilbert cell mixer of claim 16 wherein a drain of said first CMOS transistor communicates with said sources of said third and fourth CMOS transistors and a drain of said second CMOS transistor communicates with said sources of said fifth and sixth CMOS transistors, and wherein a gate of said fourth CMOS transistor communicates with a gate of said fifth CMOS transistor and a gate of said third transistor communicates with a gate of said sixth transistor.

22. The Gilbert cell mixer of claim 16 wherein a drain of said third CMOS transistor communicates with a drain of said fifth CMOS transistor and a drain of said fourth CMOS transistor communicates with a drain of said sixth CMOS transistor.

23. The Gilbert cell mixer of claim 16 wherein said first inductance is implemented on-chip using one of a spiral inductor and an asymmetric inductor.

24. A stacked Gilbert cell mixer that performs two frequency conversions in at least one of a wireless transmitter and receiver, comprising:
conversion means for converting a voltage signal input to the stacked Gilbert cell mixer to a current signal;
first frequency conversion means that communicates with said conversion means of the stacked Gilbert cell mixer for performing a first frequency conversion; and
second frequency conversion means that communicates with said first frequency conversion means of the stacked Gilbert cell mixer for performing a second frequency conversion,
wherein said conversion means includes first and second transistors, said first frequency conversion means includes third, fourth, fifth and sixth transistors and said second frequency conversion means includes seventh, eighth, ninth and tenth transistors.

25. The stacked Gilbert cell mixer of claim 24 wherein said mixer is implemented using bipolar junction transistors (BJTs).

26. The stacked Gilbert cell mixer of claim 25 wherein the stacked Gilbert cell mixer performs said first and second frequency conversions without filtering between said first and second conversions.

27. The stacked Gilbert cell mixer of claim 24 further comprising:
a first voltage source having a first output that communicates with a base of said first transistor and a second output that communicates with a base of said second transistor;
a second voltage source having a first output that communicates with bases of said fourth and fifth transistors and a second output that communicates with bases of said third and sixth transistors; and
a third voltage source having a first output that communicates with bases of said eighth and ninth transistors and a second output that communicates with bases of said seventh and tenth transistors.

28. The stacked Gilbert cell mixer of claim 24 wherein a collector of said first transistor communicates with emitters of said third and fourth transistors and a collector of said second transistor communicates with emitters of said fifth and sixth transistors, and wherein a base of said fourth transistor communicates with a base of said fifth transistor and a base of said third transistor communicates with a base of said sixth transistor.

29. The stacked Gilbert cell mixer of claim 24 wherein a collector of said third transistor communicates with a collector of said fifth transistor and a collector of said fourth transistor communicates with a collector of said sixth transistor.

30. The stacked Gilbert cell mixer of claim 24 wherein an emitter of said seventh transistor communicates with an emitter of said eighth transistor and an emitter of said ninth transistor communicates with an emitter of said tenth transistor, and wherein a collector of said seventh transistor communicates with a collector of said ninth transistor and a collector of said eighth transistor communicates with a collector of said tenth transistor.

31. The stacked Gilbert cell mixer of claim 24 wherein collectors of said third and fifth transistors communicate with emitters of said seventh and eighth transistors and wherein collectors of said fourth and sixth transistors communicate with emitters of said ninth and tenth transistors.

32. A Gilbert cell mixer for at least one of a wireless transmitter and receiver, comprising:
first, second, third, fourth, fifth, and sixth CMOS transistors that are configured to form said Gilbert cell mixer;
first current means for supplying current to sources of said third and fourth CMOS transistors;
second current means for supplying current to sources of said fifth and sixth CMOS transistors; and
first inductance means that communicates with at least one of said source of said fourth transistor and said source of said fifth transistor for substantially offsetting parasitic capacitance and noise generated by at least one of said first and second current means.

33. The Gilbert cell mixer of claim 32 wherein said first inductance means has one end that communicates with said source of said fourth CMOS transistor and an opposite end that communicates with said source of said fifth CMOS transistor.

34. The Gilbert cell mixer of claim 32 wherein said first inductance means has one end that communicates with said source of said fourth CMOS transistor and further comprising second inductance means that communicates with said source of said fifth CMOS transistor for substantially offsetting parasitic capacitance and noise generated by the other of said first and second current means.

35. The Gilbert cell mixer of claim 32 further comprising:
a first voltage source having a first output that communicates with a gate of said first CMOS transistor and a second output that communicates with a gate of said second CMOS transistor; and
a second voltage source having a first output that communicates with gates of said fourth and fifth CMOS transistors and a second output that communicates with gates of said third and sixth CMOS transistors.

36. The Gilbert cell mixer of claim 32 wherein a drain of said first CMOS transistor communicates with said sources of said third and fourth CMOS transistors and a drain of said second CMOS transistor communicates with said sources of said fifth and sixth CMOS transistors, and wherein a gate of said fourth CMOS transistor communicates with a gate of said fifth CMOS transistor.

37. The Gilbert cell mixer of claim 32 wherein a drain of said third CMOS transistor communicates with a drain of said fifth CMOS transistor and a drain of said fourth CMOS transistor communicates with a drain of said sixth CMOS transistor.

38. The Gilbert cell mixer of claim 32 wherein said first inductance means is implemented on-chip using one of a spiral inductor and an asymmetric inductor.

39. A Gilbert cell mixer for at least one of a wireless transmitter and receiver, comprising:
conversion means for converting voltage to current;
frequency conversion means for performing frequency conversion that communicates with said conversion means and that includes third, fourth, fifth, and sixth CMOS transistors;
first current means for providing current to sources of said third and fourth CMOS transistors;
second current means for providing current to sources of said fifth and sixth CMOS transistors; and
first inductance means that communicates with at least one of said source of said fourth CMOS transistor and said source of said fifth transistor for substantially offsetting parasitic capacitance and noise generated by at least one of said first and second current means.

40. The Gilbert cell mixer of claim 39 wherein said first inductance means has one end that communicates with said source of said fourth CMOS transistor and an opposite end that communicates with said source of said fifth CMOS transistor.

41. The Gilbert cell mixer of claim 39 wherein said first inductance means has one end that communicates with said source of said fourth CMOS transistor and further comprising second inductance means that communicates with the other of said source of said fourth CMOS transistor and said source of said fifth transistor for substantially offsetting parasitic capacitance and noise generated by the other of said first and second current sources.

42. The Gilbert cell mixer of claim 39 wherein said first stage includes first and second CMOS transistors.

43. The Gilbert cell mixer of claim 42 further comprising:
a first voltage source having a first output that communicates with a gate of said first CMOS transistor and a second output that communicates with a gate of said second CMOS transistor; and
a second voltage source having a first output that communicates with gates of said fourth and fifth CMOS transistors and a second output that communicates with gates of said third and sixth CMOS transistors.

44. The Gilbert cell mixer of claim 39 wherein a drain of said first CMOS transistor communicates with said sources of said third and fourth CMOS transistors and a drain of said second CMOS transistor communicates with said sources of said fifth and sixth CMOS transistors, and wherein a gate of said fourth CMOS transistor communicates with a gate of said fifth CMOS transistor and a gate of said third transistor communicates with a gate of said sixth transistor.

45. The Gilbert cell mixer of claim 39 wherein a drain of said third CMOS transistor communicates with a drain of said fifth CMOS transistor and a drain of said fourth CMOS transistor communicates with a drain of said sixth CMOS transistor.

46. The Gilbert cell mixer of claim 39 wherein said inductance is implemented on-chip using one of a spiral inductor and an asymmetric inductor.

47. A method for performing two frequency conversions using a stacked Gilbert cell mixer in a wireless transmitter, comprising:

converting a baseband input signal that is voltage-based to a baseband signal that is current-based in a first stage of said stacked Gilbert cell mixer;

converting said baseband signal to an intermediate frequency signal using a second stage of said stacked Gilbert cell mixer;

converting said intermediate frequency signal to a radio frequency signal using a third stage of said stacked Gilbert cell mixer;

providing at least one current source that communicates with said second stage; and providing a first inductance that communicates with said second stage that substantially offsets parasitic capacitance and noise generated by the at least one current source.

48. The method of claim 47 further comprising using a common bias current in said second and third stages to reduce power consumption.

49. The method of claim 47 further comprising using a single voltage to current conversion for said two frequency conversions to improve linearity of said stacked Gilbert cell mixer.

50. A method for performing two frequency conversions using a stacked Gilbert cell mixer in a wireless receiver, comprising:

converting a radio frequency input signal that is voltage-based to a radio frequency signal that is current-based in a first stage of said stacked Gilbert cell mixer;

converting said radio frequency signal to an intermediate frequency signal using a second stage of said stacked Gilbert cell mixer;

converting said intermediate frequency signal to a baseband signal using a third stage of said stacked Gilbert cell mixer;

providing at least one current source that communicates with said second stage; and providing a first inductance that communicates with said second stage that substantially offsets parasitic capacitance and noise generated by the at least one current source.

51. The method of claim 50 further comprising using a common bias current in said second and third stages to reduce power consumption.

52. The method of claim 51 further comprising using a single voltage to current conversion for said two frequency conversions to improve linearity of said stacked Gilbert cell mixer.

53. A stacked Gilbert cell mixer for at least one of a wireless transmitter and receiver, comprising:

a first stage of the stacked Gilbert cell mixer that converts a voltage signal input to the stacked Gilbert cell mixer to a current signal;

a second stage of the stacked Gilbert cell mixer that communicates with said first stage of the stacked Gilbert cell mixer and that performs a first frequency conversion;

at least one current source that communicates with said second stage; and a first inductance that communicates with said second stage that substantially offsets parasitic capacitance and noise generated by the at least one current source.

* * * * *